United States Patent [19]

Balch et al.

[11] Patent Number: 5,087,875
[45] Date of Patent: Feb. 11, 1992

[54] ISOLATED HIGH VOLTAGE TRANSFORMER FOR ELECTRIC POWER METER

[75] Inventors: Richard A. Balch, North Hampton; Andrius A. Keturakis, Portsmouth; Scott D. Velte, Rochester, all of N.H.

[73] Assignee: General Electric Company, Somersworth, N.H.

[21] Appl. No.: 505,194

[22] Filed: Apr. 5, 1990

[51] Int. Cl.⁵ .............................................. G01R 1/00
[52] U.S. Cl. .............................. 324/157; 324/103 R; 324/142; 336/65
[58] Field of Search ............... 324/103 R, 103, 117 R, 324/117 H, 127, 142, 157; 336/65, 92; 174/35 R, 35 C; 363/144, 146; 361/364, 369, 372, 374

[56] References Cited

U.S. PATENT DOCUMENTS

| | | | |
|---|---|---|---|
| 3,191,135 | 6/1965 | Hazelquist | 336/65 |
| 4,267,399 | 5/1981 | Lux, jr. | 336/65 |
| 4,626,813 | 12/1986 | Koga et al. | 336/65 |
| 4,631,476 | 12/1986 | Germer et al. | 324/103 R |
| 4,652,975 | 3/1987 | Scott | 336/65 |
| 4,709,205 | 11/1987 | Baurand et al. | 336/65 |
| 4,713,610 | 12/1987 | Willis | 324/157 |
| 4,737,903 | 4/1988 | Nishikawa et al. | 363/144 |
| 4,881,070 | 11/1989 | Burrowes et al. | 324/103 R |
| 4,922,382 | 5/1990 | Hobbins | 174/35 R |
| 4,972,140 | 11/1990 | Okazaki et al. | 324/117 R |
| 4,977,368 | 12/1990 | Munday et al. | 324/157 |

Primary Examiner—Kenneth A. Wieder
Assistant Examiner—William J. Burns
Attorney, Agent, or Firm—Robert E. Brunson; Irving M. Freedman

[57] ABSTRACT

An electronic register in an electric energy meter includes a power supply transformer mounted on and through the register circuit board which is positioned between the base of the meter and the register indicator. Shrouds isolate and insulate the connections within the shrouds to the primary winding of the transformer, and positioning members are provided to secure the transformer to the circuit board while at the same time providing positioning for the secondary winding terminal pins which pass through the circuit board to enable their proper connection, such as by soldering, to the circuit board. A unitary molded bobbin provides a spool for the transformer windings and core, the positioning members, the shrouds, and securing of the secondary winding terminal pins.

24 Claims, 3 Drawing Sheets

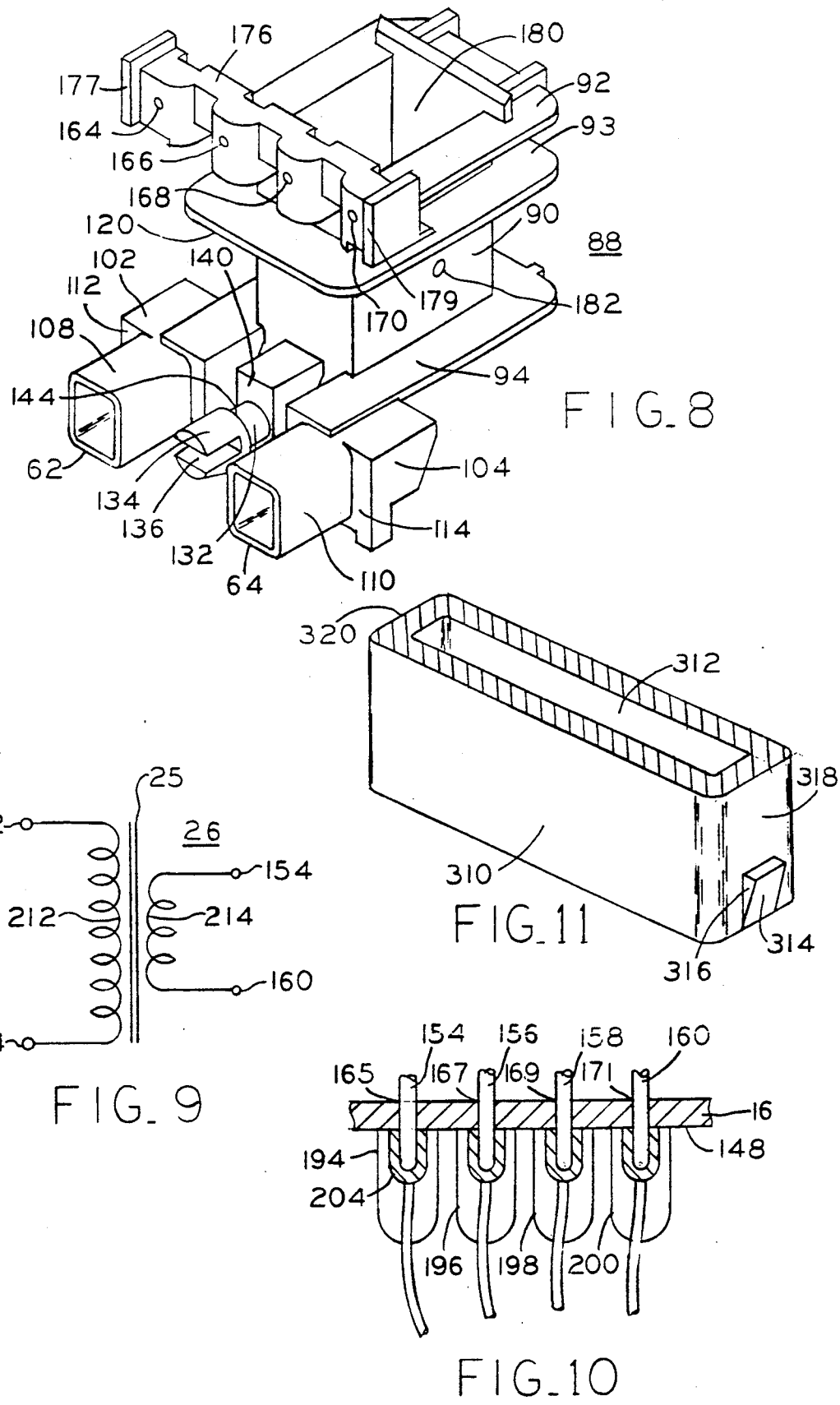

ISOLATED HIGH VOLTAGE TRANSFORMER FOR ELECTRIC POWER METER

BACKGROUND OF INVENTION

The present invention relates to electric energy meters, and more particularly to the use of an isolated high voltage transformer within such a meter.

The use of electronics in electric energy meters has enabled the design of energy meters with greatly increased capability and functions. However, there is increasing pressure for such meters to have fewer parts and to be substantially smaller than previous designs. Fewer parts are required in order to minimize manufacturing costs including the cost of materials and assembly, and the subsequent cost and number of components which must be maintained for spare parts and repair purposes, along with an increase in reliability which accompanies designs which have fewer parts.

It is common to mount the power supply transformer for electronic registers in energy meters on a separate printed wiring board or plate positioned between the base of the meter and the register assembly. The present invention includes the mounting of the power supply transformer on the register printed circuit board in order to avoid the expense and space required through use of a separate printed circuit board or plate for the power supply transformer which requires additional mounting and interconnection. However, the use of a separate printed circuit board or plate positioned intermediate the base of the energy meter and the register printed circuit board is advantageous in that it isolates the primary side of the power supply transformer from the register printed circuit board. The low voltage circuitry of the register circuit board must be isolated from high voltage surges present on the power lines being measured and which are provided to the primary side of the power supply transformer since such surges may be in the order of up to 8,000 volts. In addition to isolating the register electronics from possible high voltages, it is desirable to avoid including the high voltage primary power circuit in the circuitry of the register printed circuit board.

OBJECTS AND SUMMARY OF INVENTION

It is an object of the present invention to minimize the components and size of an electronic energy meter.

It is another object of the present invention to mount the power supply transformer on the register circuit board of an electronic energy meter while at the same time isolating the primary winding high voltages from the low voltage register circuitry.

It is yet another object of the present invention to mount the power supply transformer on the register circuit board of an electronic energy meter while avoiding the inclusion of the high voltage primary circuit in the circuitry of the register printed circuit board.

Still another object of the present invention is to provide an improved yet simple method of mounting the power supply transformer on the register printed circuit board of an electronic energy meter.

It is a further object of the present invention to simplify the assembly and maintenance of the power supply and power supply transformer for an electronic energy meter.

In accordance with one embodiment of the present invention an encapsulated power supply transformer is mounted on the register printed circuit board in an electric energy meter. The primary terminals of the transformer are fully insulated and isolated from the printed circuit board by plastic shrouds which are molded integral with the transformer winding bobbin. The shrouds pass through the printed circuit board and facilitate the connection of the primary terminals of the transformer to the power line voltages without utilizing circuitry on the register printed circuit board. The power supply transformer is held in place by a positioning fastener molded integral with the winding bobbin, and by a series of electrical terminal pins in the bobbin which are connected to the secondary side of the transformer and which pass through the register circuit board to be secured on the opposite side.

The transformer winding bobbin also includes spacers which position the transformer relative to the register circuit board to facilitate soldering of the electrical terminal pins to the circuit board. The primary terminals may be offset in the shrouds to provide polarization for the connector which connects them to the power lines, and the bobbin is configured to provide a spool for the transformer windings plus central aperture for the laminated core of the transformer.

DRAWINGS AND BRIEF DESCRIPTION OF INVENTION

FIG. 8 is an enlarged view of the transformer bobbin used in the present invention.

FIG. 9 is a schematic of the transformer of FIGS. 6, 7, and 8.

FIG. 10 is an enlarged partial cross section of a portion of the power transformer secondary terminals when installed in accordance with one embodiment of the present invention.

FIG. 11 is a simplified view of an alternate embodiment of a portion of the present invention.

Figure 1:
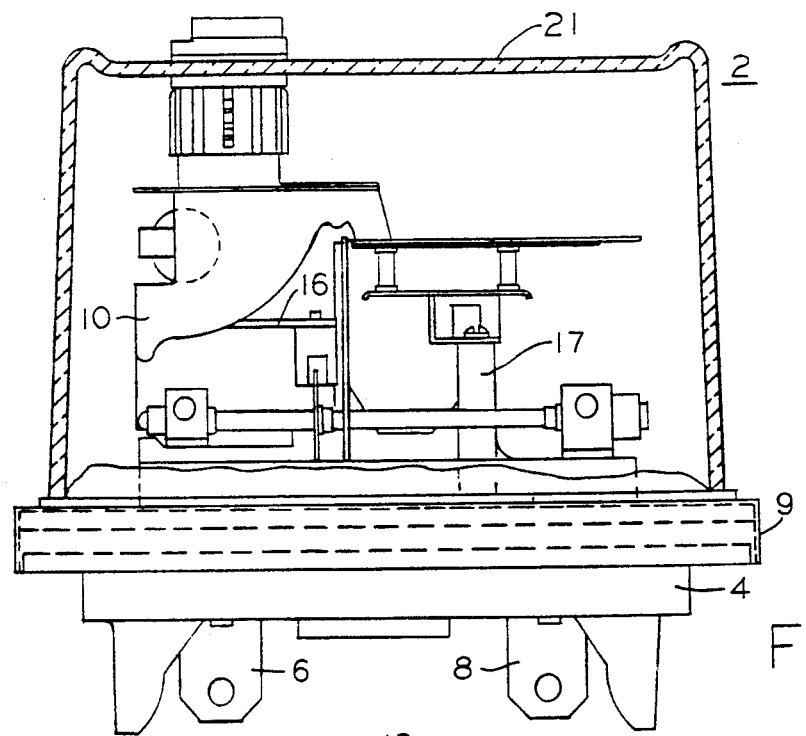
FIG. 1 is a side view of an energy meter/register incorporating one embodiment of the present invention.

Referring first to FIG. 1, an electronic energy meter 2 is shown in simplified form and includes a base 4 having a plurality of meter circuit terminals such as 6 and 8 extending through the base to connect the meter in circuit with a power source and a load which is to be metered. A register assembly 10, including a liquid crystal display or read out 12 (see FIG. 2), is positioned at the other end of the energy meter 2, with an intermediate electronic assembly including the register printed circuit board 16 carrying a plurality of electronic components (shown in FIG. 3) and supported by the energy meter frame 17. A transparent cover or housing 21 surrounds the meter components, and in combination with a locking ring 9 and the base 4 encloses the assembly. The transparent cover or housing 21 is commonly made of glass or a transparent polycarbonate.

Figure 2:
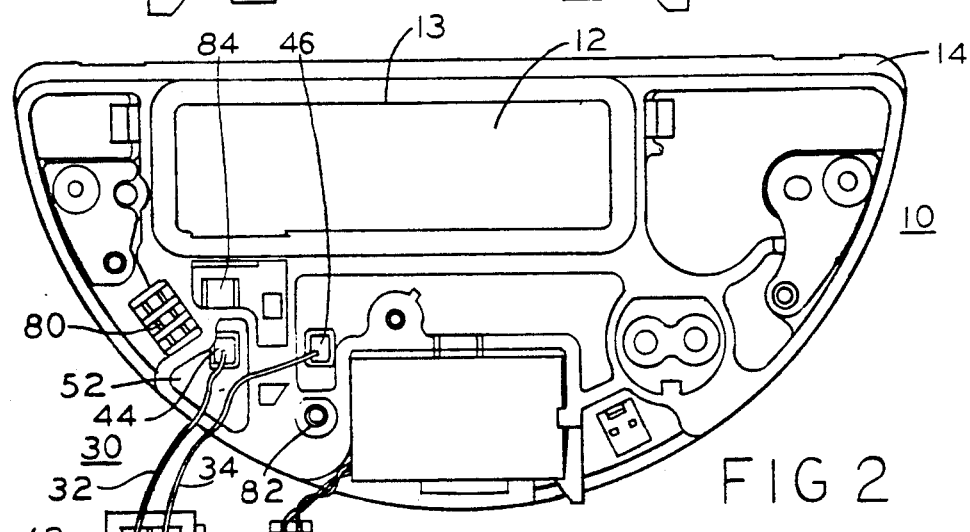
FIG. 2 is an enlarged front view of a register assembly for the electronic energy meter of FIG. 1.
Figure 3:
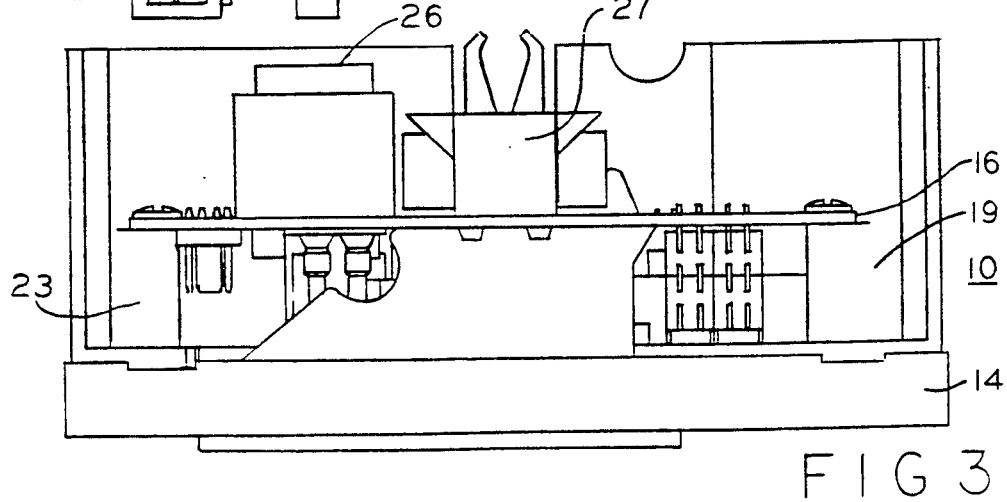
FIG. 3 is a top view of the register assembly shown in FIG. 2.
Figure 4:
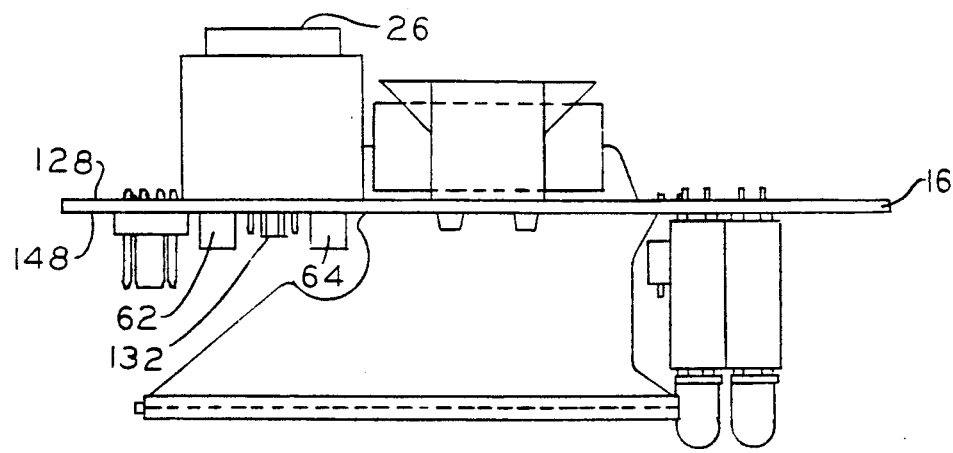
FIG. 4 is the top view of the register printed circuit board assembly of one register assembly shown in FIGS. 2 and 3.
Figure 5:
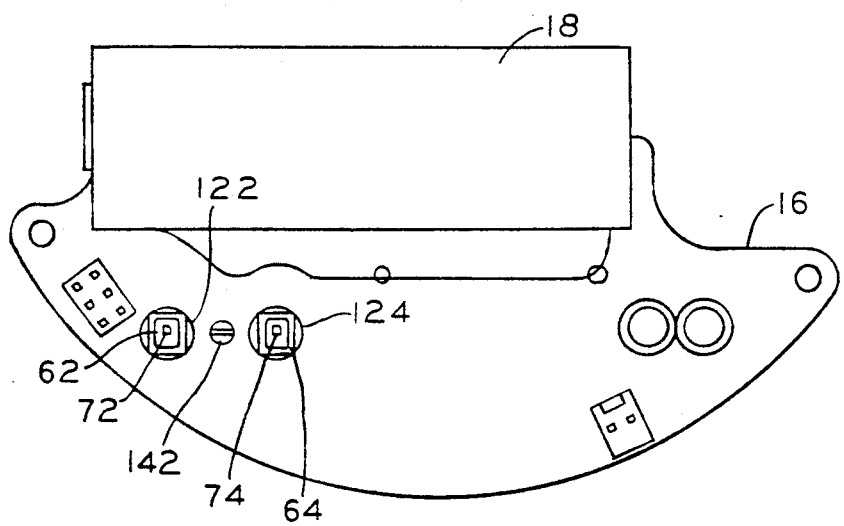
FIG. 5 is the front view of FIG. 4.

Referring next to FIGS. 2 and 3, the meter-register assembly 10 includes a read-out window 13 provided within, and molded as part of, the register enclosure 14. The printed circuit board 16 is positioned beneath and spaced from the enclosure 14 by spacers 19 and 23 which are molded integral with the enclosure 14. The power supply transformer 26 is mounted on the side of the register printed circuit board 16 which is remote from the read-out window 13 through which the liquid crystal display 12 may be read. The disk sensing optics assembly 27 is also mounted on the register printed circuit board 16. The disk sensing optics assembly 27 is described in detail in copending patent application Ser. No. 07/505,383, issued Jul. 23, 1991, as U.S. Pat. No. 5,034,682 of A. A. Keturakis, R. C. Mayo and S. D. Velte, assigned to the same assignee as the present invention, and hereby incorporated by reference. The construction and mounting of the power supply transformer 26 is described in detail below.

The line voltage from the power lines is brought to the power supply transformer 26 through the power supply connector 30 which includes electrical leads 32 and 34 which are attached at one end to the power line plug 42 for connection to a mating plug assembly which is connected through the base 4 terminals such as 6 and 8 to the power lines, and at the other end to connectors 44 and 46 for electrical connection to the primary winding of the power supply transformer 26. Electrical lead 32 extends through opening 52 in enclosure 14 to the base of the power supply transformer 26, while electrical lead 34 extends through the opening 52 and under the enclosure to the power supply transformer.

The insulating winding bobbin 60 upon which the power supply transformer 26 is fabricated is shown in FIG. 8. Referring to FIG. 8, it is to be noted that the insulated winding bobbin 60 includes a pair of legs or shrouds 62 and 64 which extend from the base 66 through the register printed circuit board 16 as best shown in FIGS. 3, 4, 5, 6, and 7. The shrouds 62 and 64 include central rectangular apertures 66 and 68, respectively (best shown in FIG. 7), which include primary pins 72 and 74, respectively, of the power supply transformer 26. Thus, the insulated female connectors 44 and 46 (see FIG. 2) may be slid into the shrouds 62 and 64, respectively, to make electrical contact with the primary pins 72 and 74 of the power supply transformer 26 in a secure and electrically isolated fashion. The shrouds 62 and 64 isolate the register printed circuit board 16 from any high voltages present at the primary terminals or pins 72 and 74. This arrangement allows the placement of electronic components and circuit patterns in close proximity to the primary terminals or pins 72 and 74. The primary pins 72 and 74 of the power supply transformer 26 are not centrally located. The outer ends of primary pin 72 and primary pin 74 are offset, being positioned slightly above the center of their shrouds 62 and 64, respectively, providing polarization so that the female connectors 44 and 46 can not be improperly oriented.

Figures 6, 7:
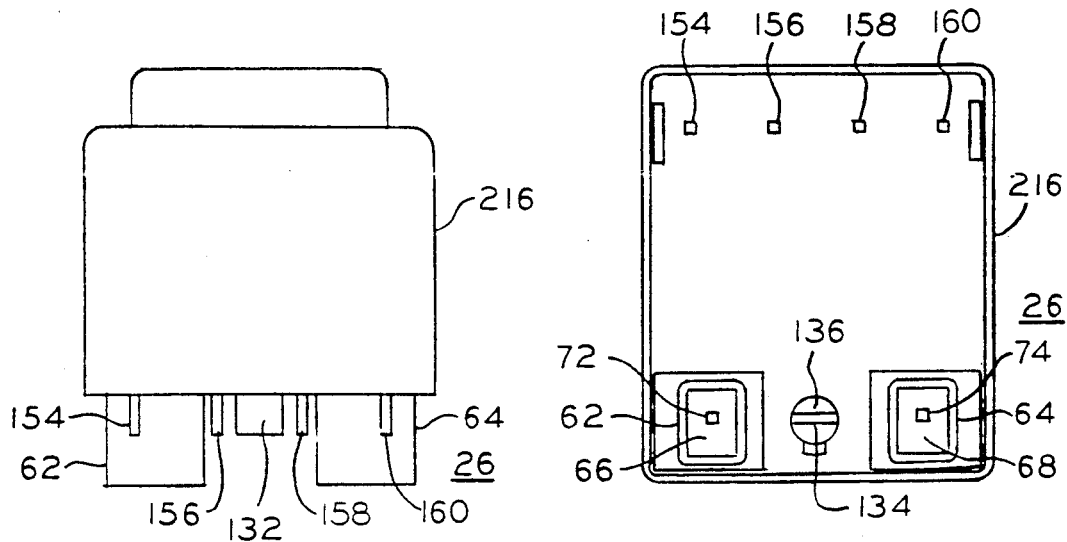
FIG. 6 is an enlarged top view of the high voltage power transformer shown in FIG. 3.
FIG. 7 is the front view of the transformer shown in FIG. 6.

The construction of the power supply transformer 26 can best be understood with reference to FIGS. 6, 7, and 8. Referring first to FIG. 8, the power supply transformer bobbin 88 is a unitary molded support which includes a central spool 90 sandwiched between end plates 92 and 94. The transformer primary winding 212 and secondary winding 214 are wound upon the central spool 90 on either side of the central flange 93, and the ends of the primary windings are connected to the primary pins 72 and 74 which, as shown in FIG. 7, are secured within the shrouds 62 and 64. As shown in FIG. 8, the shrouds 62 and 64 extend outwardly and substantially parallel to end plate 94. The shrouds 62 and 64 each include an enlarged inner portion, 102 and 104 respectively, adjacent end plate 94 with steps or shoulders 112 and 114, respectively, where the enlarged inner portions of the shrouds meet the extension portions 108 and 110, respectively. When the power supply transformer 26 is positioned on register circuit board 16 with the shrouds extending through apertures 122 and 124 (see FIGS. 4 and 5), the power supply transformer is stably supported upon the register printed circuit board by contact of the shoulders 112 and 114 with the surface 128 of the register printed circuit board 16. This provides firm support for securing the power supply transformer 26 to the register printed circuit board 16 with the secondary pins or terminals 154, 156, 158 and 160 extending through and secured in place on the opposite side 148 of the register printed circuit board.

Positioned between, and extending parallel to, the shrouds 62 and 64 is the generally U-shaped fastening member 132 (see FIG. 8) which includes resilient parallel jaws 134 and 136 extending outward from shoulder 140. The generally U-shaped fastening member 132, including the resilient parallel jaws 134 and 136, can be compressed to extend through the register printed circuit board 16 to provide a snap fastener molded integral with the power transformer bobbin 88. A step or shoulder 144 may be provided on the resilient jaws 134 and 136 such that the free or open ends of the jaws are of a larger diameter than the inner edge adjacent the shoulder 140 to provide a positive snap action and detent to hold against the opposite surface 148 of register printed circuit board 16 after the resilient jaws 134 and 136 are forced toward one another and inserted through rounded aperture 142 in the register circuit board 16 (see FIG. 5). The resiliency of the compressed jaws 134 and 136 after insertion through aperture 142 causes the ends of the jaw to open and extend over the aperture and surrounding circuit board 16. The snap action secures the power supply transformer 26 in position with the shoulders 112 and 114, and the surfaces 177 and 179 of the transformer terminal board or member 176, positioned against the surface 128 of the register printed circuit board 16.

In addition to the snap action of the resilient jaws 134 and 136 of the U-shaped fastening member 132 upon insertion through aperture 142, the power supply transformer 26 is further secured to the register printed circuit board 16 by the secondary winding pins or terminals 154, 156, 158, and 160 (see FIGS. 6 and 7). The transformer secondary winding pins or terminals 154, 156, 158, and 160 which pass through the apertures 164, 166, 168, and 170 respectively of the register printed circuit board. The secondary winding terminal pins 154, 156, 158 and 160 extend through the terminal board member 176 in the transformer bobbin 88 (see FIG. 8) which may be molded integral with, and attached to, the end plate 92 remote from the central spool 90, and depending on the circuitry and power requirements of the register printed circuit board 16 and its electronic components, either 2, 3, or 4 secondary pins or terminals 154, 156, 158, and 160 may be provided and/or utilized. The laminated core 215 of the transformer passes through internal chamber 180 formed within the spool 90 (upon which the windings 212 and 214 for power supply transformer 26 are wound). The laminations for the core 215 is formed of pi-shaped and L-shaped members which together include a central leg which is inserted into the internal chamber 180 within spool 90, and 4 sides, so that the stack may be built up surrounding the primary winding 212 and secondary winding 214 with a central leg through the internal chamber. The transformer 26 may then be "potted" or encapsulated in an insulating epoxy.

Upon mounting the transformer 26 on the register printed circuit board as described above, the secondary pins 154, 156, 158, and 160 pass through apertures in the register printed circuit board. In one embodiment of the present invention (see FIG. 10) mating female connectors 194, 196, 198, and 200 are applied from the opposite surface 148 of the register printed circuit board. The female connectors 194, 196, 198, and 200 each include a surrounding sleeve of greater diameter than the secondary winding pins 154, 156, 158, and 160 and also of the apertures through which they pass, namely 165, 167, 169, and 171, respectively. As a result, the sleeves 204, 206, 208, and 210 press against the opposite surface 148 of the register printed circuit board 160 to detachably secure the power supply transformer 26 in position on the register printed circuit board 16. However, in a preferred embodiment, the secondary winding pins 154, 156, 158 and 160 are soldered to the register printed circuit board 16 and the power supply transformer 26 is not readily detachable once attached.

It is to be noted that in the preferred embodiment, the U-shaped fastening member 132 provides both positioning and fastening of the power supply transformer 26 to the register printed circuit board with the secondary pins 154, 156, 158 and 160 presented in proper positions for soldering to the opposite side 148 of the register printed circuit board. Since there are no associated flexible leads the power supply transformer 26 may be readily inserted onto, and soldered to, the register printed circuit board 16 by automated equipment and procedures. Thus, the design of the present invention is made amenable to automated manufacturing.

The electrical connections for the power supply transformer 26 are shown by the electrical schematic in FIG. 9. Referring to FIG. 9, it is seen that the power supply transformer 26 includes a primary winding 212, a secondary winding 214, and a core 215, with the ends of the primary winding 212 connected to terminals or pins 72 and 74 while one secondary winding 214 is connected to secondary terminals or pins 154 and 160. The secondary winding 214 provides an appropriate reduced voltage to the power supply circuitry which provides the electrical power to the register printed circuit board 16. While not necessary in a preferred application, an appropriate magnetic shield or "can" 216 (see FIG. 7) may be positioned around the power supply transformer bobbin 88 and it's associated primary winding 212 and secondary winding 214. Alternatively, potting compound may surround the completed power supply transformer 88 without&: a magnetic shield 216.

Thus, the power supply transformer 26 may be easily, yet securely mounted to the register printed circuit board 16 by inserting the shrouds 62 and 64 through apertures 122 and 124, respectively, in the register printed circuit board while at the same time inserting the secondary pins 154, 156, 158, and 160 through mating apertures 165, 167, 169, and 171, respectively, in the register printed circuit board, and also at the same time pressing the jaws of the U-shaped fastening member 132 through the aperture 142 in the register printed circuit board until the step 144 snaps into place on the opposite side 148 of the register printed circuit board. After the register circuit board is mounted within the energy meter 2, the power supply primary connector 30 is connected by sliding the insulated female connectors 44 and 46 into the shrouds 62 and 64, respectively, to contact the primary pins 72 and 74, respectively. The mating female connectors 194, 196, 198, and 200, if used, are then slid over the secondary pins 154, 156, 158, and 160, respectively, which extend beyond the opposite side 148 of the register printed circuit board 16, thus securing the power supply transformer 26 in place on the register printed circuit board. Alternatively, in the preferred embodiment the secondary pins 154, 156, 158 and 160 are soldered to the register printed circuit board 16 before the register circuit board is mounted within the energy meter 2. Both embodiments not only secure the power supply transformer 26 in place on the register printed circuit board 16, but also allow the placement of electronic component and circuit patterns such as 80, 82, and 84 in close proximity to, and even between, the primary terminals 72 and 74. The contact housing assembly for the insulated female connectors 44 and 46 once installed can only be removed by pulling on the housing, insuring that connections to the primary terminals 72 and 74 are made in a secure and isolated fashion. It is to be noted that the electronic component and circuit patterns such as 80, 82, and 84 may be positioned on the opposite surface 148 of the register printed circuit board 16 directly opposite the power supply transformer 10 assembly since the circuit board is fully isolated from the primary connections to the power supply transformer, thus maximizing the available space on the register circuit board for components and circuitry.

In addition, printed circuit "runs", or connections, may be made on the upper surface 128 of the printed circuit board 16 directly under the power transformer 26 around the apertures for the shrouds 62 and 64, further reducing the size requirements for the electronic energy meter/register 2. This results in a smaller energy meter with fully isolated primary windings, and a reduction in the components otherwise required by conventional meters with a separate power supply printed circuit board or plate.

While separate shrouds are shown and described above for isolating primary terminals 72 and 74, a single shroud of adequate size could surround both terminals. In that case, a unitary two pin female connector could be utilized to connect to the primary terminals 72 and 74 within the shroud in place of separate connectors 44 and 46. However, the space between the two terminals would no longer be available for positioning components, or for the fastening member 132. Also, the shrouds 62 and 64 may be square or round in cross section, or of any other suitable shape. In addition, the fastening member 132 may be cylindrical or tapered without the U-shaped jaws, in which case the free end of it may be headed over after insertion through register printed circuit board 16 through use of a hot gun to upset the free end. If a single shroud of a generally rectangular shape is used, the snaps could be provided on the ends of the shroud instead of fastening member 132. Such an arrangement is shown in simplified form in FIG. 11.

Referring to FIG. 11, the bottom section of the single alternate embodiment, generally rectangular shroud 310 is shown including a central aperture 312 suitable for enclosing both primary terminals 72 and 74. At the outer periphery of ends 318 and 320 latches or snaps 314 are molded integral with the power supply transformer bobbin 88 and shroud 310. The snaps 314 are tapered along the end 318 with increasing thickness away from the outer end as shown by tapered side 316. The shroud 310 is positioned in a mating generally rectangular opening in register circuit board 16 after which pressure is applied to the power supply transformer 26 to force the wedged latches 314 through the generally rectangular opening. The resiliency of the plastic shroud 310 allows the latches 314 to be forced toward one another and through the opening, after which the compressed resiliency causes them to snap apart around the opposite side of the opening and over the register circuit board 16 to latch the power supply transformer in position on the register printed circuit board. If two shrouds are used, one or two latches such as 314 could be provided on each shroud in lieu of the U-shaped fastening member 132.

Thus, while the present invention has been described through preferred embodiments, such embodiments are provided by way of example only. Numerous variations, changes and substitutions, including those discussed above will occur to those skilled in the art without departing from the scope of the present invention and the following claims.

What we claim is:

1. An electronic energy meter comprising:
   base means comprising means for connecting said electronic energy meter in circuit with a source of power and a load to be metered;
   electronic register assembly means spaced from and supported on said base means and including register means, output indicator means, and a register circuit board positioned intermediate said output indicator means and said base means;
   power supply transformer means mounted on said register circuit board and including a primary winding and at least one secondary winding;
   said secondary winding connected in circuit with the circuitry for said electronic register assembly means;
   said power supply transformer means including primary terminals for connecting said primary winding in circuit with said base means, and one or more shrouds of insulating material extending through said register circuit board and surrounding said primary terminals; and
   means to secure said power supply transformer means to said register circuit board.

2. The electronic energy meter of claim 1 wherein said transformer means includes a unitary insulating bobbin with a spool portion on which said primary winding and said secondary winding are wound, said bobbin being positioned on one side of said register circuit board with said one or more shrouds extending from said spool portion through said register circuit board.

3. The electronic energy meter of claim 2 wherein said bobbin further includes a fastening member extending through said register circuit board to enable said power supply transformer means to be positioned on and secured to said register circuit board.

4. The electronic energy meter of claim 3 wherein said unitary bobbin further includes secondary winding terminal pins extending through said bobbin, the inner ends of said secondary winding terminal pins being connected to said secondary winding of said power supply transformer means, and the remote ends of said secondary terminal pins extending through apertures in said register circuit board.

5. The electronic energy meter of claim 4 wherein said secondary winding terminal pins are soldered to said register circuit board.

6. The electronic energy meter of claim 5 wherein a magnetic radiation shield is positioned around said spool portion of said bobbin and around said primary winding and said secondary windings of said power supply transformer means.

7. The electronic energy meter of claim 3 wherein said fastening member includes a plurality of resilient spaced jaws which can be pressed toward each other and through an aperture in said register circuit board, said fastening member having a cross section at the ends thereof which, when said jaws are not pressed toward each other is larger than said aperture in said register circuit board, such that the resiliency of said spaced jaws after being forced through said aperture moves the ends of said jaws to extend over said aperture and surrounding circuit board to detachably secure said power supply transformer means to said register circuit board.

8. The electronic energy meter of claim 7 wherein said bobbin further includes shoulders adjacent said one or more shrouds which seat against one side of said register circuit board when said power supply transformer means is positioned on said register circuit board with said shroud and said fastening member extending through said register circuit board, whereby said power supply transformer means may be secured to said register circuit board.

9. The electronic energy meter of claim 8 wherein said power supply transformer means includes secondary winding terminal pins with remote ends which extend through apertures in said register circuit board, and female connectors having a surrounding insulating sleeve are detachably connected to said remote ends of said secondary winding terminal pins on the side of said register circuit board opposite to said primary and secondary windings and within said insulating sleeve, said female connectors connecting said secondary winding of said power supply transformer means in circuit with the electronics on said register circuit board.

10. The electronic energy meter of claim 1 wherein each of said one or more shrouds include at least one internally positioned connector pin extending within each of said shrouds enabling isolated electrical connection from the side of said register circuit board opposite to said primary and secondary windings of said power supply transformer means.

11. The electronic energy meter of claim 10 wherein said transformer means includes a bobbin forming a central spool portion surrounding a central cavity, and a first end plate and a second end plate extending from the ends of said central spool portion.

12. The electronic energy meter of claim 11 wherein said spool portion, said first end plate, said second end plate, and said one or more shrouds are part of a unitary, molded insulating material, power supply transformer bobbin.

13. The electronic energy meter of claim 12 wherein a detachable connector assembly is provided including insulated contacts which are slid within said one or more shrouds to contact said terminals for connecting said primary winding in circuit with said base assembly.

14. The electronic energy meter of claim 13 wherein at least one of said connector pins within said one or more shrouds are offset to provide polarization for connection of said detached connector assembly.

15. The electronic energy meter of claim 14 wherein said power supply transformer means includes a core passing through said central cavity, and is encapsulated with an insulating material.

16. The electronic energy meter of claim 15 wherein said core is laminated.

17. The electronic energy meter of claim 1 wherein electronic circuitry components are positioned around said shroud on the surface of said register circuit board opposite said primary winding and said secondary winding of said power supply transformer means.

18. In an electronic energy meter for connecting in circuit with power lines which may include power surges, and which is configured to facilitate automated assembly, a power supply comprising:

a circuit board including electronic circuitry to be energized by said power supply;

a power supply transformer mounted on said circuit board and including an integral molded bobbin comprising a spool portion around which the primary and secondary windings of said transformer are wound, and one or more shrouds extending away from said spool portion;

said one or more shrouds passing through one or more first apertures in said circuit board, and one or more primary terminals extending into said one or more shrouds and connected in circuit with said primary winding for connection in circuit with said power lines;

said integral bobbin supporting and positioning a plurality of secondary terminal pins at least some of which are connected in circuit with said secondary winding;

said integral bobbin including positioning and securing means to position said power supply transformer on said circuit board with said secondary terminal pins extending through second apertures in said circuit board;

means to connect said secondary terminal pins in circuit with the electronic circuitry of said circuit board.

19. The electronic power supply for an electronic energy meter of claim 18 wherein said positioning and securing means pass through an aperture in said circuit board to secure said power supply transformer on the side of said circuit board opposite to said bobbin.

20. The electronic power supply for an electronic energy meter of claim 19 wherein said circuit board is a printed circuit board, and said means to connect said secondary terminal pins in circuit with the electronic circuitry of said circuit board is by solder connections.

21. The electronic power supply for an electronic energy meter of claim 20 wherein said positioning and securing means includes one or more spacers extending toward said printed circuit board and away from said spool portion to space said transformer, including said secondary terminal pins, relative to said printed circuit board.

22. The electronic power supply for an electronic energy meter of claim 21 wherein said transformer includes a core passing through a central region defined, at least in part, by said spool, and said transformer is encapsulated.

23. The electronic power supply for an electronic energy meter of claim 22 wherein one or more female connectors are provided to connect through a base in said electronic energy meter to the power lines, and said one or more female connectors are configured to slide within said one or more shrouds and over said primary terminals surrounded by said one or more shrouds.

24. The electronic power supply for an electronic energy meter of claim 23 wherein said terminals surrounded by said one or more shrouds are offset within said one or more shrouds to provide polarization for the connection of said female connectors.

* * * * *